(12) United States Patent
Yu et al.

(10) Patent No.: US 6,717,208 B2
(45) Date of Patent: Apr. 6, 2004

(54) DISABLING FLASH MEMORY TO PROTECT MEMORY CONTENTS

(75) Inventors: Hung-Chang Yu, Taipei (TW); Fei-Wen Cheng, Hsinchu (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 10/167,123

(22) Filed: Jun. 11, 2002

(65) Prior Publication Data

US 2003/0228728 A1 Dec. 11, 2003

(51) Int. Cl.[7] ............................................. H01L 29/792
(52) U.S. Cl. ....................... 257/324; 257/315; 257/316; 438/257; 438/276; 365/185.29
(58) Field of Search ................................. 257/315, 316, 257/324; 438/257, 276; 365/185.29

(56) References Cited

U.S. PATENT DOCUMENTS

| 5,650,649 A | * | 7/1997 | Tsukiji ........................ 257/316 |
| 5,732,021 A | * | 3/1998 | Smayling et al. ......... 365/185.29 |
| 5,914,904 A | * | 6/1999 | Sansbury ..................... 365/218 |

* cited by examiner

*Primary Examiner*—Nathan J. Flynn
*Assistant Examiner*—Scott R. Wilson
(74) *Attorney, Agent, or Firm*—Tung & Associates

(57) ABSTRACT

Disabling flash memory cells to protect their contents, and thus essentially transforming them into read-only memory (ROM) cells, is disclosed. A gate mask and an implant code mask are positioned over a given flash memory cell. A field oxide layer is then fabricated within a substrate layer of the cell through the masks as logically and'ed together. By such fabrication, the flash memory cell is at least partially disabled. The masks are preferably a gate mask and an implant code mask, as these masks typically are already existing and available for use.

13 Claims, 8 Drawing Sheets

PRIOR ART FIG 1
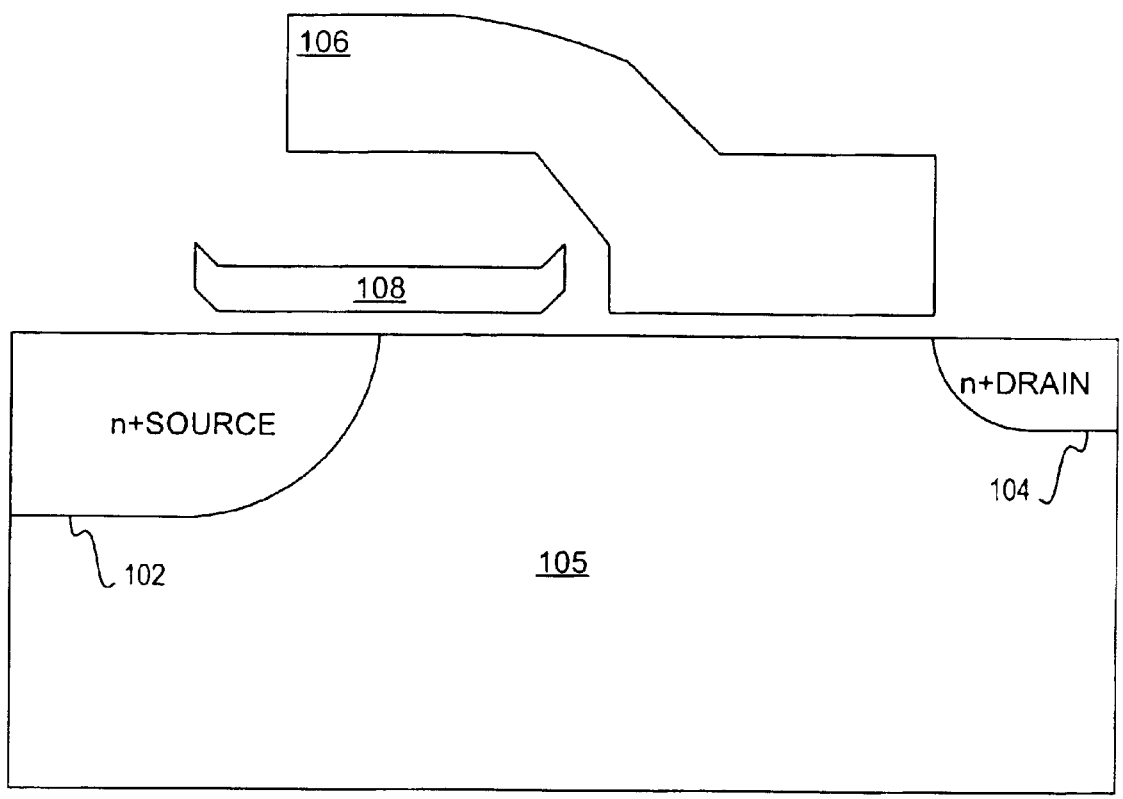
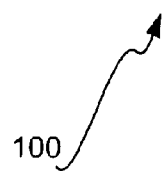

PRIOR ART      FIG 2
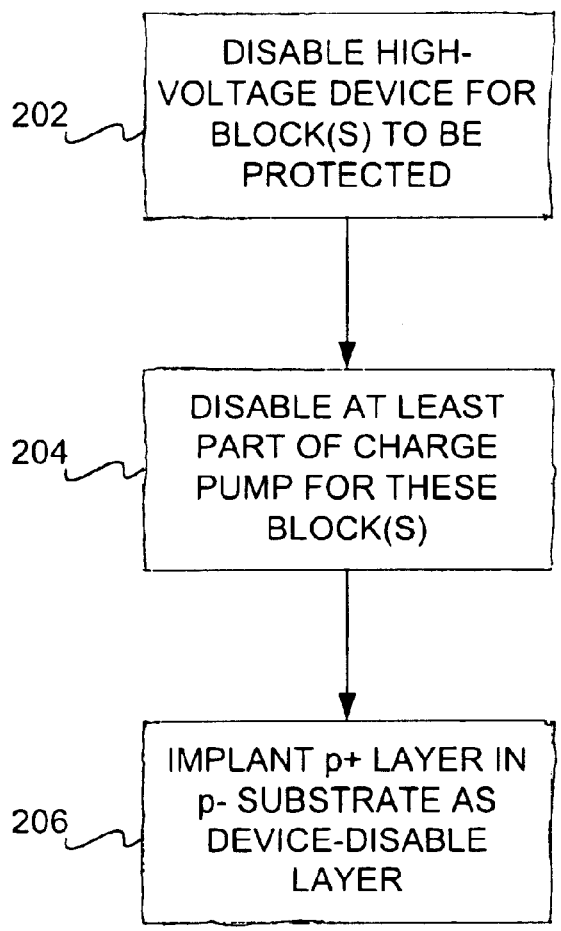

DISABLING FLASH MEMORY TO PROTECT MEMORY CONTENTS

FIELD OF THE INVENTION

This invention relates generally to semiconductor memories, and more particularly to semiconductor flash memories.

BACKGROUND OF THE INVENTIONS

There are many different types of memories that can be fabricated using semiconductors. One type of memory is random-access memory (RAM), which is a volatile memory. The memory can be programmed and erased to hold information while power is being supplied. However, when power is not supplied, the memory loses its contents. Another type of memory is read-only memory (ROM), which is a non-volatile memory. The memory cannot be reprogrammed nor erased, but retains its contents even when power is not supplied to the memory.

Other kinds of memories include programmable read-only memories (PROM's), erasable PROM's (EPROM's), and electrically erasable PROM's (EEPROM's, or E$^2$PROM's). These types of memory are like ROM's in that they are non-volatile, retaining their content contents even when power is not supplied. However, unlike ROM's, they are programmable. In the case of PROM's, they are programmable once, whereas in the case of EPROM's and EEPROM's, they can be erased, such as by applying ultraviolet (UV) light for EPROM's, and electrically for EEPROM's, and then reprogrammed.

A special type of EEPROM is the memory. Whereas EEPROM's must be erased one byte at a time, flash memories can be erased a section at a time, and thus much more quickly. Like other memories, a flash memory has a grid of columns and rows, with a memory cell at each intersection. FIG. 1 shows an example flesh memory cell 100. The flash memory cell includes n+ regions 102 and 104 within a channel substrate 105. The n+ region 102 functions as the source, whereas the n+ region 104 functions as the drain. There is a floating gate 108 and a control gate 106, each of which can be polysilicon, or poly for short. The flash memory cell 100 is a split-gate flash memory cell. The control gate 106 is connected to a word line.

During a read operation, a voltage is applied to the control gate 106. If the floating gate 108 has been programmed, the transistor formed by the source 102, the channel 105, and the drain 104 will not conduct. Conversely, if the floating gate 108 has not been programmed, then the transistor will conduct. The conducting state is output as a logic one, whereas the non-conducting state is output as a logic zero. To erase the programming of the floating gate 108, the channel 105 is placed into inversion to deplete the charge from the floating gate 108. Conversely, to write or program the floating gate 108, charge is placed onto the floating gate 108.

Often, once a flash memory has been programmed to a given state, it is desirable to protect one or more blocks of the memory, effectively transforming these parts of the flash memory into a ROM. For example, a flash memory may include data and a programming routine for changing the data. If the memory becomes corrupted due to power supply or other problems, the memory cannot be programmed, because the programming routine has also been corrupted. However, if the programming routine is write protected, so that it has been transformed into ROM, then even if the data is corrupted, the flash memory can be reprogrammed, since the programming routine remains intact.

FIG. 2 shows the overall process used to transform flash memory into ROM, as the method 200. First, the high-voltage device for the block(s) of the flash memory to be protected is disabled, or removed (202). These high-voltage devices are those that enable the contents of the flash memory to be erased. Thus, an external high-voltage source is required to erase the selected block(s) of the flash memory, which in practical application where such an external source is unavailable, effectively means that the block(s) cannot be erased. Second, at least part of the charge pump for these block(s) are also disabled (204). The charge pumps normally enable these block(s) of the flash memory to be programmed. Without operative charge pumps, the block(s) cannot be programmed.

Finally, a p+ layer is implanted in the p− substrate of the flash memory cells of the block(s) to be disabled, to act as device-disable layers for these individual flash memory cells (206). The p+ implant is also referred to as a code implant. FIG. 3 shows the traditional approach for this implantation. A code implant mask 302 with a hole 304 is positioned over the polysilicon gates 106 (the gate 108 having been removed to disable the memory cell 300), and p+ particles are implanted into the p− substrate 122, as indicated by the arrow 306. This results in the p+ implant layer 308 within the p− substrate 122. The p+ layer 308 further serves to transform the flash memory cell 300 into a ROM cell.

The approach outlined in FIG. 3, however, only works for 0.5-micron semiconductor processes. Semiconductor processes are continually shrinking, so that semiconductor devices, like memories, can become smaller, faster, and have higher densities. For 0.35-micron processes in particular, the p+ layer implantation approach of FIG. 3 does not work. This is because for 0.35-micron process flash memories, one or both of the polysilicon gates—that is one or both of the control gate and the floating gate—are thicker than in 0.5-micron process flash memories. The added thickness of the gates, while enabling the flash memories to function, inhibits implantation of p+ particles into the p− substrate.

One solution that has been used with limited success is to implant the p+ particles at the edge of the code implant mask, at an angle, to fabricate the p+ layer. FIG. 4 shows this improved approach. Rather than implanting the p+ particles through the hole 304 of the code implant mask 302, as was accomplished in the approach of FIG. 3, implantation of the p+ particles is performed at an angle, to either or both sides of the mask 302, as indicated by the arrows 402 and 404. This forms the p+ layer 308 as before. In this way, the p+ implantation does not have to proceed through the polysilicon gates 106 and 108, which, because of their increased thickness, inhibit the implantation. The angles 406 and 408 of the implantations indicated by the lines 402 and 404, respectively, usually are less than forty-five degrees.

However, in some densely packed parts of some flash memories, or in some wholly densely packed flash memories, even this improved approach does not work. This is explained with reference to FIG. 5, which shows a flash memory section 500. The flash memory section 500 has flash memory cells 502, 504, and 506. Each cell has a source, a drain, and a substrate, as the memory cell 100 of FIG. 1 does, but which are not numbered for purposes of illustrative clarity. Each cell also has a transistor gate, where the flash memory cell 502 has the gate 508, the memory cell 504 has the gate 510, and the cell 506 has the gate 512.

A code implant mask 514 is again positioned over one of the memory cells, in this case the memory cell 504, to implant a p+ layer within the substrate of the memory cell 504. Because the gate 510 of the cell 504 are sufficiently thick, the p+ particles cannot be implanted through the gate 510 as before. However, the p+ particles also cannot be implanted at the edges of the mask 514, at an angle, as they could with the memory cell 400 of FIG. 4. This is because the memory cells 502, 504, and 506 are too close to one another, and in particular, their gates are too close to one another. For example, attempting to implant at the left edge of the mask 514 at an angle, as indicated by the arrow 516, is not possible, because the gate 508 of the cell 502 are in the way. Similarly, implanting at the right edge of the mask 516 at an angle, as indicated by the arrow 518, is not possible, because the gate 512 of the cell 506 are in the way.

It has been found that if the spacing of the gates of individual cells is not at least 0.9 micron, then angled mask-edge p+ layer implantation is not possible. This means that for flash memories having densely packed sections, or for densely packed flash memories more generally, such memories, or blocks of such memories, cannot be transformed into ROM's, because p+ layer implantation is not possible. This limitation reduces the utility of newer flash memories, relegating their use only in situations where conversion of one or more blocks of such memories to ROM is not needed or desirable.

Therefore, there is a need to overcome these described disadvantages with transforming flash memories to ROM's. In particular, there is a need for an improved process to help transform the flash memory cell to a ROM cell, to cut off the p− substrate, as has traditionally been accomplished with p+ layer implantation. Such an improved process should be able to be performed even where the individual flash memory cells of a flash memory are close together, such as where the gates of the individual cells are less than 0.9 micron apart. For these and other reasons, there is a need for the present invention.

SUMMARY OF THE INVENTION

The invention relates to disabling flash memory cells to protect their contents, thus essentially transforming them into read-only memory (ROM) cells. A gate mask and an implant code mask are positioned over a given flash memory cell. A field oxide layer is then fabricated within a substrate layer of the cell through the masks as logically and'ed together. By such fabrication, the flash memory cell is at least partially disabled. The masks are preferably a gate mask and an implant code mask, as these masks typically are already existing and available for use.

The invention provides for advantages over the prior art. A flash memory cell is transformed to a ROM cell by cutting off the p− substrate of the flash memory cell, but with the use of a field oxide layer instead of p+ layer implantation. This means that the disadvantages of using p+ layer implantation are avoided. Specifically, the flash memory disabling process of the invention can be performed even where the individual flash memory cells of a flash memory are close together, and even where the gates of the cells are thick. Thus, the disabling process of the invention can be used in 0.35-micron process flash memories, where the flash memory cells of such memories may be less than 0.9 micron apart.

Still other advantages, aspects, and embodiments of the invention will become apparent by reading the detailed description that follows, and by referencing the accompanying drawings.

BRIEF DESCRIPTION OF THE DRAWINGS

FIG. 1 is a diagram of a typical flash memory cell.

FIG. 2 is a flowchart of a prior art method for disabling a flash memory cell, to convert the flash memory cell into a read-only memory (ROM) cell.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 3:
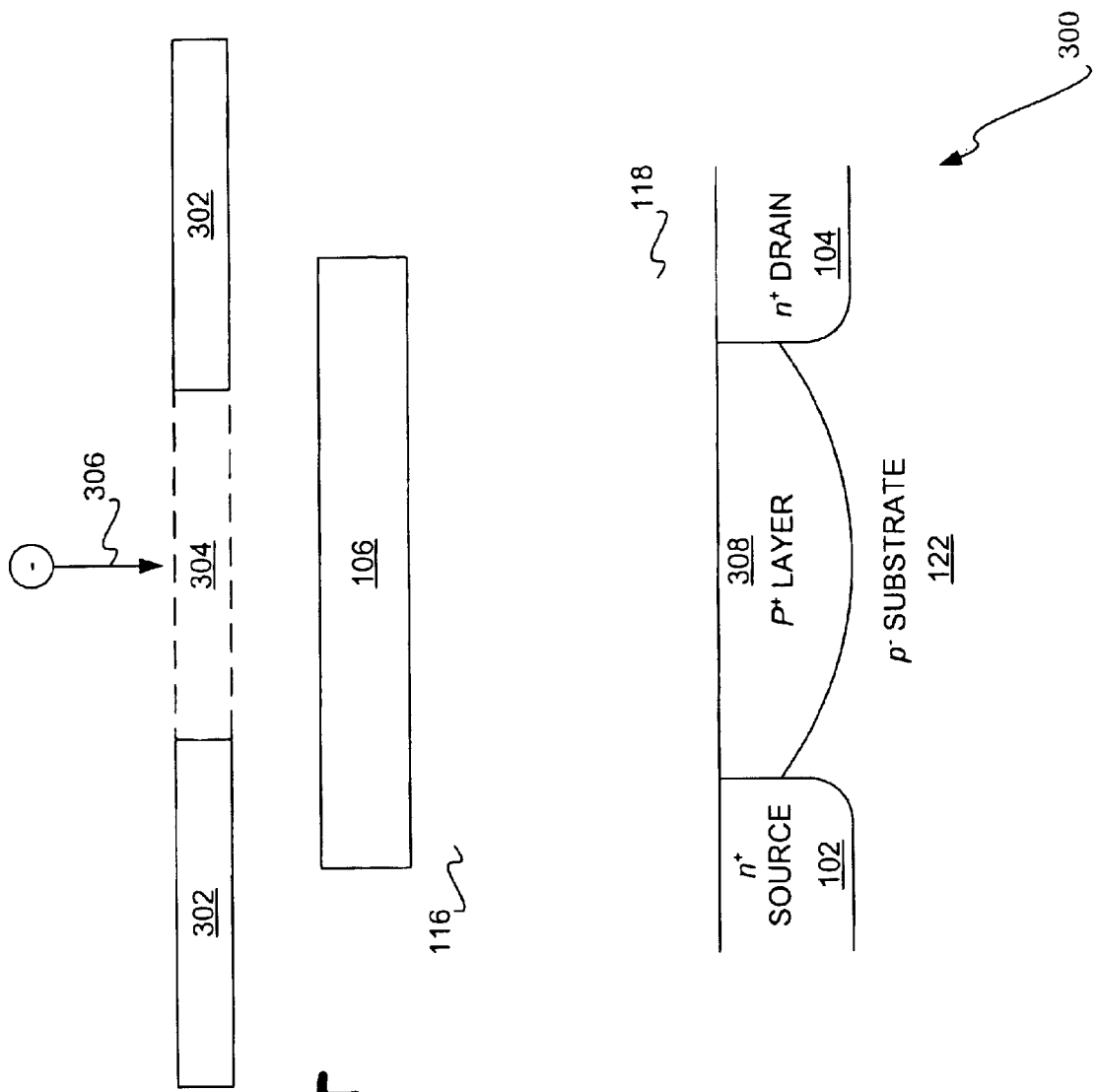
FIG. 3 is a diagram showing one approach to the p+ layer implantation part of the method of FIG. 2 as performed on the memory cell of FIG. 1.
Figure 4:
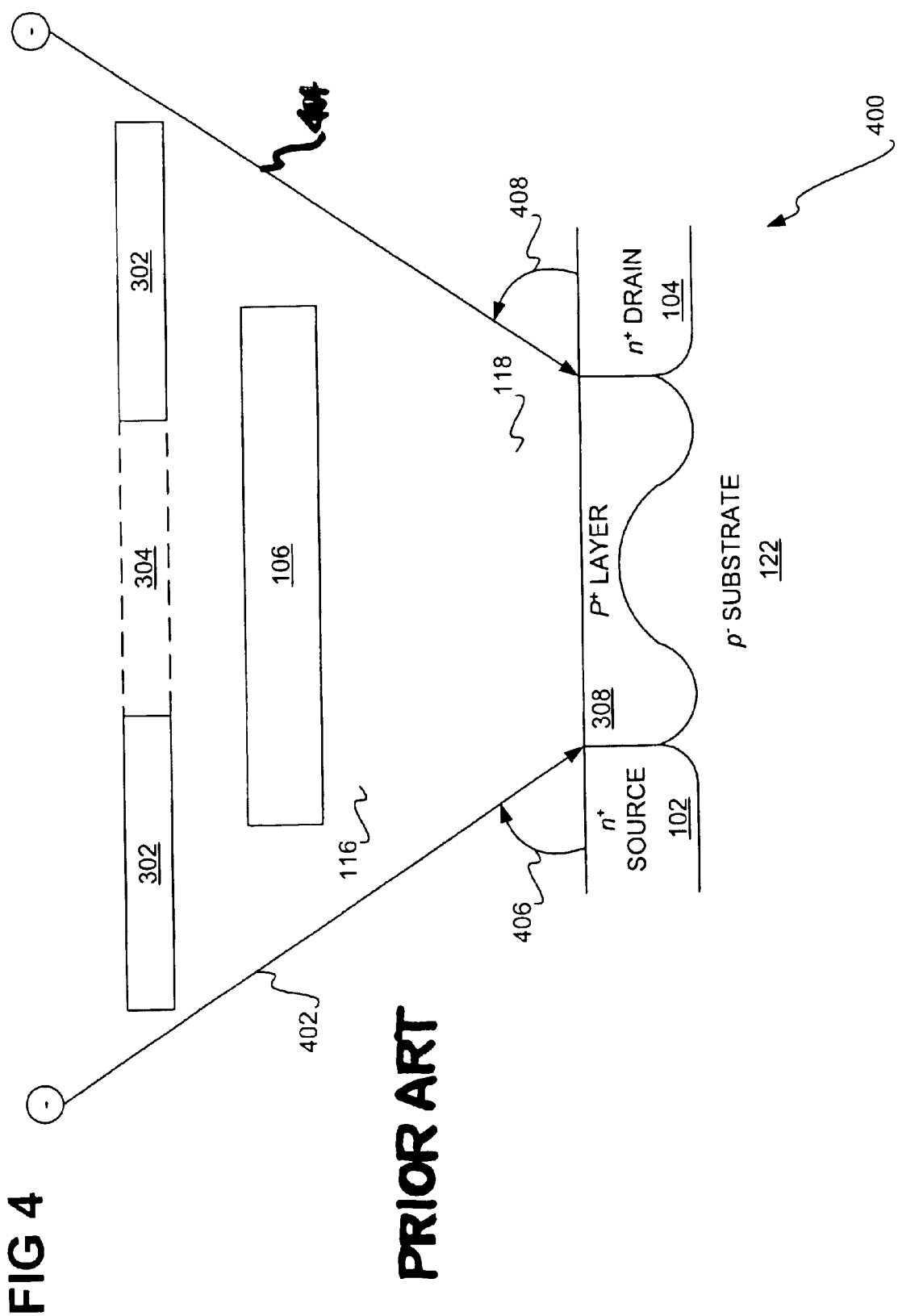
FIG. 4 is a diagram showing an alternative approach to the p+ layer implantation part of the method of FIG. 2 as performed on the memory cell of FIG. 1, where the approach of FIG. 3 is unable to be performed due to the thickness of one or both of the control and floating gates of the memory cell.
Figure 5:
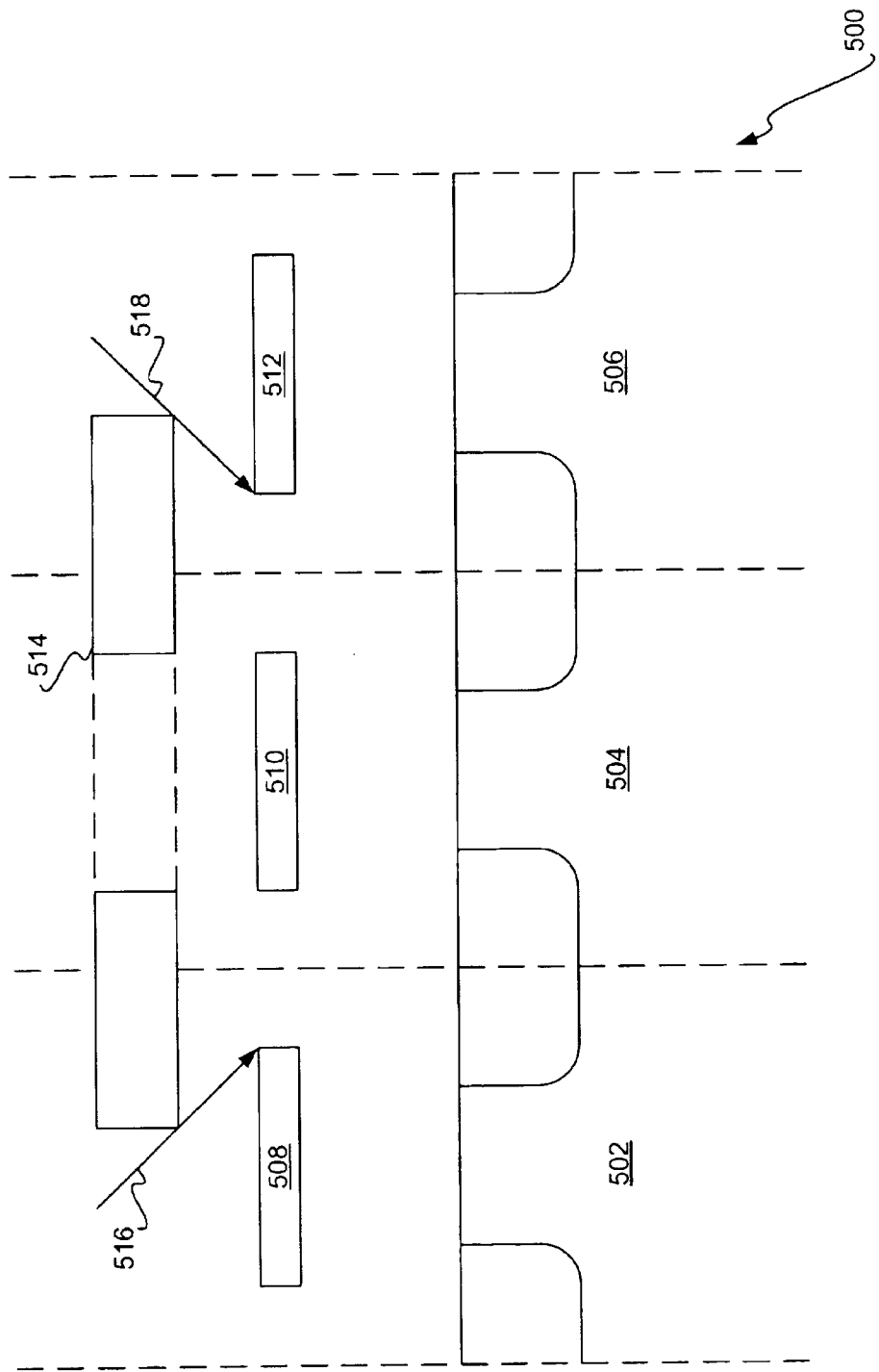
FIG. 5 is a diagram showing how even the alternative approach of FIG. 4 cannot be used to disable a 0.35-micron process flash memory cell having flash memory cells and/or gates thereof separated by no more than 0.9 micron.
Figure 6:
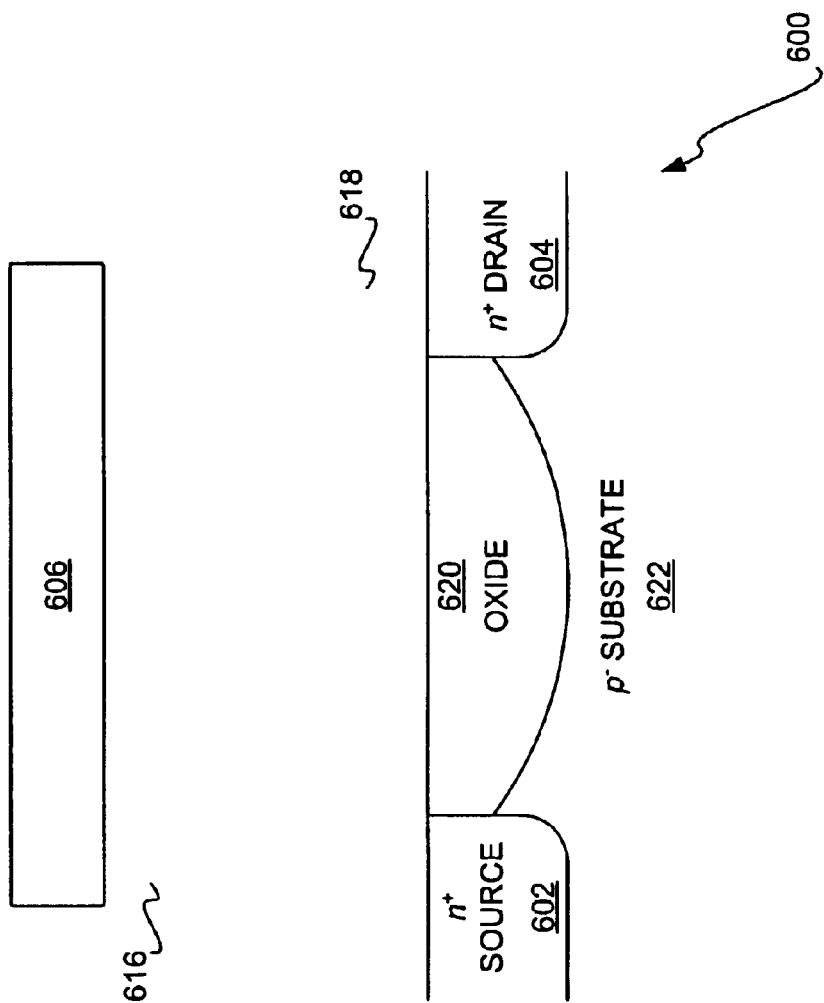
FIG. 6 is a diagram of a flash memory cell that has a field oxide layer within a p− substrate layer to disable the flash memory cell, transforming the cell into a ROM cell, according to an embodiment of the invention.

FIG. 6 shows a disabled flash memory cell 600 according to an embodiment of the invention. The flash memory cell 600 includes a transistors formed between the n+ source 602 and the n+ drain 604 through the control gate 606, where the floating gate has already been removed. The 606 is preferably polysilicon, or poly. There are also two oxide layers, the oxide layer 616 and the oxide layer 618.

The field oxide layer 620 at least partially disables the semiconductor flash memory cell 600, such that it no longer can be programmed or erased. The state of the cell 600 prior to introduction or fabrication of the oxide layer 620 is thus its permanent state, such that the memory cell 600 effectively becomes or is transformed into a read-only memory (ROM) cell. That is, the field oxide layer 620 at least partially protects the contents of the memory cell 600 from erasure or reprogramming. The memory cell 600 is preferably one of many flash memory cells of a semiconductor flash memory, as may be partitioned into different blocks. Each block has a high-voltage device for erasing the cells in the block, and a charge pump for reprogramming the cells of the block. Preferably, the high-voltage device and the charge pump of the block containing the memory cell 600 are also disabled, to prevent erasure and reprogramming, respectively, of the memory cells of the block, including the flash memory cell 600. Other, normal-voltage (non-high-voltage) devices are also disabled.

Figure 7:
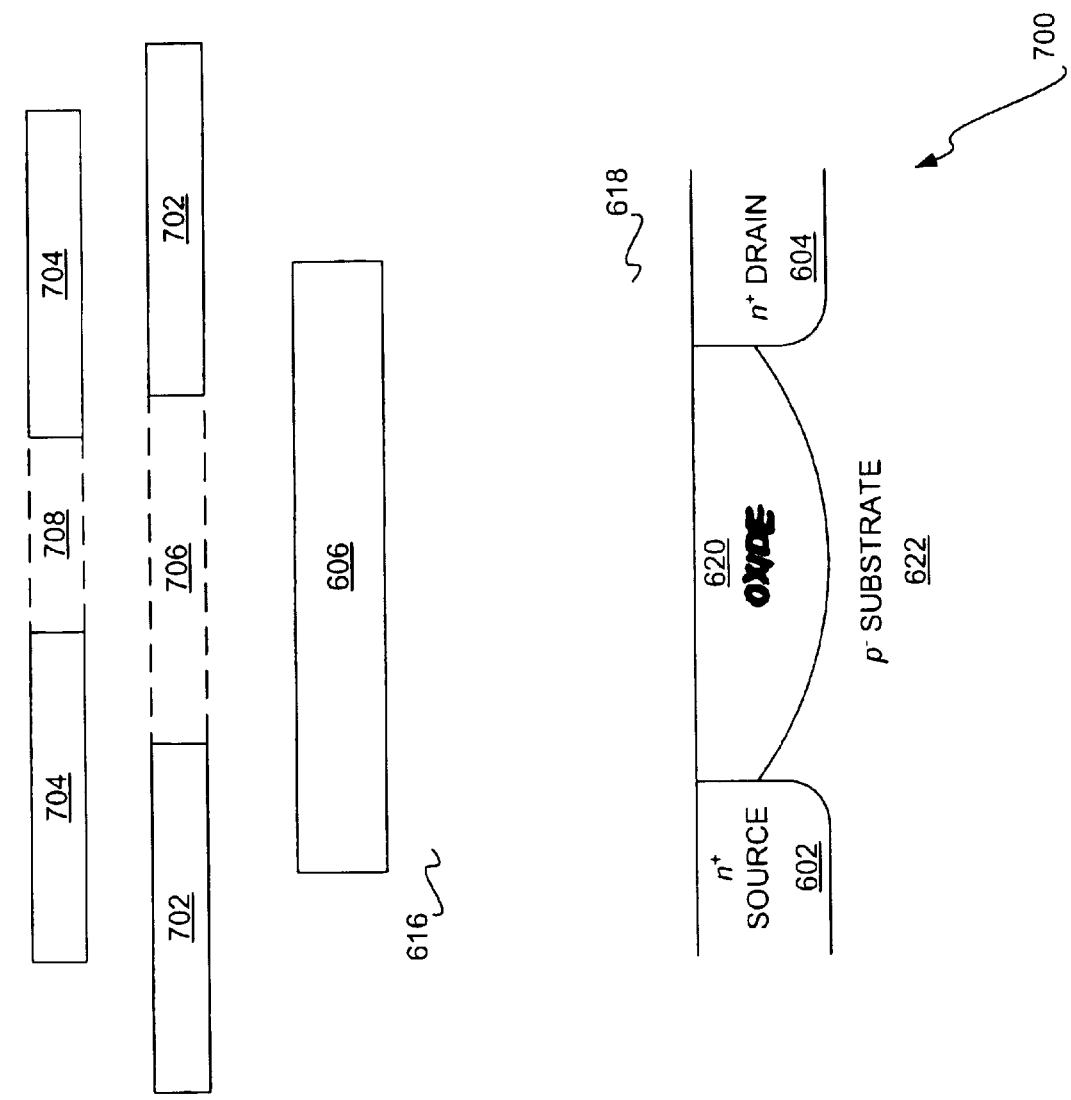
FIG. 7 is a diagram showing how the flash memory cell of FIG. 6 can be disabled by preferably using a polysilicon gate mask and a code implant mask logically and'ed together, according to an embodiment of the invention.

FIG. 7 shows a memory cell 700 indicating how one embodiment fabricates the field oxide layer 620 within the substrate layer 622 of the cell 700. Like-numbered components of the memory cell 700 are identical to their counterparts of the memory cell 600 of FIG. 6, such that description thereof is not duplicated to avoid redundancy. There are two masks positioned over the memory cell 700, a polysilicon gate mask 702, and a p+ implant, or code implant, mask 704. The mask 702 has a hole 706 therein having a width corresponding to the width of the gate 606. The mask 704 has a hole 708 therein having a width corresponding to the width of the area within the p− substrate 622 that would normally have been implanted with p+ particles.

The field oxide mask 620 is fabricated through the logical and'ing of the masks 702 and 704. The larger width of the mask 702 ensures that neighboring memory cells to the memory cell 700 are not affected by the processes performed to effect the oxide layer 620 within the substrate layer 622. The smaller width hole 708 of the mask 704 ensures that the source 602 and the drain 604 of the memory cell 700 are not affected by the processes performed to effect the oxide layer 620 within the substrate layer 622. These two masks 702 and 704 are preferably selected, as opposed to two other masks, since they typically are already in existence for the performance of other tasks, specifically the formation of the gate 606, and the implantation of p+ particles within the substrate 622, respectively. Other masks can also be used, however. Furthermore, although the mask 704 is shown as over the mask 702 in FIG. 7, the opposite can also be true, with the mask 702 over the mask 704.

Figure 8:
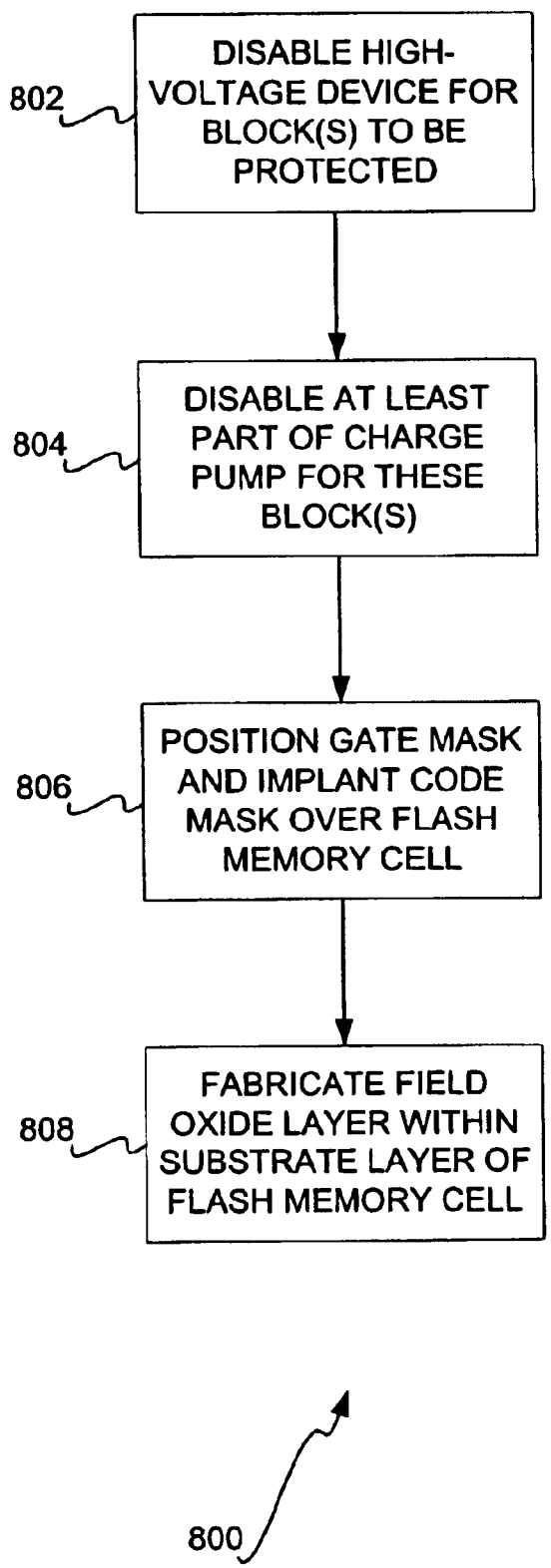
FIG. 8 is a flowchart of a method for disabling a flash memory cell, such that, for example, the memory cell of FIG. 6 results, according to an embodiment of the invention, consistent with the diagram of FIG. 7.

FIG. 8 shows a method 800 indicating how one embodiment achieves the disabled flash memory cell 600 of FIG. 6 as illustratively shown with reference to the disabled flash memory cell 700 of FIG. 7. First, the high-voltage device for the block(s) of the flash memory to be protected is disabled, or removed (802). These high-voltage devices are those that enable the contents of the flash memory to be erased. Thus, an external high-voltage source is required to erase the selected block(s) of the flash memory, which in practical application where such an external source is unavailable, effectively means that the block(s) cannot be erased. Second, at least part of the charge pump for these block(s) are also disabled (804), as well as some normal-voltage devices. The charge pumps normally enable these block(s) of the flash memory to be programmed. Without operative charge pumps, the block(s) cannot be programmed.

Next, the gate mask and the implant code mask are positioned over the flash memory cell (806), as indicated in FIG. 7, and a field oxide layer is fabricated within the substrate layer of the flash memory cell (808), as also indicated in FIG. 7. 806 and 808 are desirably repeated for each flash memory cell of the block of flash memory cells of the semiconductor flash memory being disabled. The field oxide layer is fabricated through the masks as logically and'ed together. The field oxide layer further disables the flash memory cell on an individual basis. The field oxide layer thus completes the conversion of the flash memory cell into a ROM cell. The previously programmed contents of the cell are now protected, such that the contents can only be read, but not changed, consistent with a ROM cell. The memory cell remains a non-volatile memory cell, in that even when no power is supplied to the cell, its contents remain.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A semiconductor flash memory having one or more blocks of flash memory cells, the flash memory cells of at least one of the one or more blocks each comprising:

a substrate;

an oxide layer within the substrate to at least partially disable the flash memory cell to protect contents of the cell;

a floating gate over the substrate that is removed to at least partially disable the flash memory cell; and, a control gate over the floating gate.

2. The memory of claim 1, wherein the oxide layer of each memory cell is fabricated by using a pair of masks logically and'ed together.

3. The memory of claim 2, wherein the pair of masks comprises a gate mask and an implant code mask.

4. The memory of claim 1, wherein each flash memory cell further comprises a source and a drain at opposite sides of the substrate.

5. The memory of claim 1, wherein each of the one or more blocks comprises a high-voltage device for erasing the flash memory cells of the block.

6. The memory of claim 5, wherein the high-voltage device of each of the at least one of the one or more blocks is disabled, to prevent erasure of the contents of the memory cells of the block.

7. The memory of claim 1, wherein each of the one or more blocks comprises a charge pump for reprogramming the flash memory cells of the block.

8. The memory of claim 7, wherein the charge pump of each of the at least one of the one or more blocks is disabled, to prevent reprogramming of the contents of the memory cells of the block.

9. A semiconductor flash memory at least partially disabled to protect contents of the memory by at least in part performing a method comprising:

positioning a first mask over the semiconductor flash memory cell;

positioning an implant code mask over the semiconductor flash memory cell; and, fabricating a field oxide layer within a substrate layer of the semiconductor flash memory cell through the first mask and the second mask as logically and'ed together.

10. The memory of claim 9, the method further initially comprising disabling a high-voltage device for the semiconductor flash memory cell to prevent erasure of the contents of the memory.

11. The memory of claim 9, the method further initially comprising disabling at least a part of a charge pump for the semiconductor flash memory cell to prevent reprogramming of the contents of the memory.

12. The memory of claim 9, wherein the first mask comprises a gate mask.

13. The memory of claim 9, wherein the second mask comprises a code implant mask.

* * * * *